United States Patent
Biermann et al.

(10) Patent No.: US 10,845,047 B2
(45) Date of Patent: Nov. 24, 2020

(54) HERMETICALLY GASTIGHT OPTOELECTRONIC OR ELECTRO-OPTICAL COMPONENT AND METHOD FOR PRODUCING THE SAME

(71) Applicant: Micro-Hybrid Electronic GmbH, Hermsdorf (DE)

(72) Inventors: Steffen Biermann, Hermsdorf (DE); André Magi, Mertendorf (DE); Patrick Sachse, Kraftsdorf (DE)

(73) Assignee: Micro-Hybrid Electronic GmbH, Hermsdorf (DE)

( * ) Notice: Subject to any disclaimer, the term of this patent is extended or adjusted under 35 U.S.C. 154(b) by 610 days.

(21) Appl. No.: 14/276,921

(22) Filed: May 13, 2014

(65) Prior Publication Data
US 2014/0340904 A1    Nov. 20, 2014

(30) Foreign Application Priority Data
May 14, 2013 (DE) .......................... 10 2013 104 964

(51) Int. Cl.
*F21V 31/00* (2006.01)
*G01J 1/04* (2006.01)
(Continued)

(52) U.S. Cl.
CPC .............. *F21V 31/005* (2013.01); *F21V 7/00* (2013.01); *G01J 1/0271* (2013.01);
(Continued)

(58) Field of Classification Search
USPC ......................................................... 362/267
See application file for complete search history.

(56) References Cited

U.S. PATENT DOCUMENTS 2,647,218 A * 7/1953 Sorg .................... H01J 19/34
174/17.08
5,127,075 A * 6/1992 Althaus ................ G02B 6/4246
250/227.14
(Continued)

FOREIGN PATENT DOCUMENTS

DE    3335530 A1    4/1985
DE    4301457 A1    8/1994
(Continued)

*Primary Examiner* — Sharon E Payne
(74) *Attorney, Agent, or Firm* — Patentbar International, P.C.

(57) ABSTRACT

A method for producing a hermetically gastight optoelectronic or electro-optical component with great robustness to heat and moisture is described. A housing cap is connected to a carrier in a hermetically gastight manner. Orifices in the housing cap are closed in a hermetically gastight manner by a window element. An electronic component with a housing has a housing cap, a carrier as base plate of the housing, and an interior space enclosed by the housing cap and the carrier. An optoelectronic or electro-optical converter element is arranged in the interior space. The housing cap is closed in a hermetically gastight manner by the carrier through a bonding connection of fused metal. The orifice is connected to the housing cap in a hermetically gastight manner by a window element along an edge metallization of the window element by a circumferential first seam of a fused metallic material.

5 Claims, 11 Drawing Sheets

(51) Int. Cl.
*F21V 7/00* (2006.01)
*G01J 1/42* (2006.01)
*G01J 5/04* (2006.01)
*G01J 1/02* (2006.01)
*H05K 5/00* (2006.01)

(52) U.S. Cl.
CPC .......... *G01J 1/0418* (2013.01); *G01J 1/0437* (2013.01); *G01J 1/0492* (2013.01); *G01J 1/4228* (2013.01); *G01J 5/045* (2013.01); *H05K 5/0095* (2013.01)

(56) References Cited

U.S. PATENT DOCUMENTS

| | | | |
|---|---|---|---|
| 5,483,095 A * | 1/1996 | Kagawa | H01L 31/0203 250/338.1 |
| 5,721,430 A | 2/1998 | Wong | |
| 8,169,684 B2 * | 5/2012 | Bugno | B60R 1/088 359/265 |
| 2002/0105591 A1 * | 8/2002 | Nakamura | H01L 27/14618 348/373 |
| 2003/0034436 A1 | 2/2003 | Muramatsu | |
| 2005/0127281 A1 * | 6/2005 | Zheng | G02B 6/4206 250/239 |
| 2005/0224715 A1 | 10/2005 | Devine | |
| 2008/0291426 A1 * | 11/2008 | Azimi | G01J 3/02 356/51 |
| 2008/0296719 A1 * | 12/2008 | Ichikawa | G01J 5/04 257/434 |
| 2011/0299084 A1 * | 12/2011 | Feitisch | G01J 3/28 356/433 |

FOREIGN PATENT DOCUMENTS

| | | |
|---|---|---|
| DE | 19823691 A1 | 12/1999 |
| DE | 102004013850 A1 | 10/2005 |
| DE | 102004031317 A1 | 1/2006 |
| DE | 102004031318 A1 | 1/2006 |
| DE | 102005003657 A1 | 2/2006 |
| DE | 102005024512 B3 | 2/2007 |
| DE | 202009006481 U1 | 10/2009 |
| DE | 102009012394 A1 | 11/2010 |
| EP | 1727210 A2 | 11/2006 |
| EP | 1764609 A2 | 3/2007 |
| JP | H0799368 A | 4/1995 |
| JP | 2009200433 A | 9/2009 |

* cited by examiner

HERMETICALLY GASTIGHT OPTOELECTRONIC OR ELECTRO-OPTICAL COMPONENT AND METHOD FOR PRODUCING THE SAME

RELATED APPLICATIONS

This application claims priority to German Patent Application No. DE 10 2013 104 964.8, filed May 14, 2013, which is incorporated herein by reference in its entirety.

FIELD AND BACKGROUND OF THE INVENTION

The invention is directed to a hermetically gastight electronic component such as is known generically from DE 33 35 530 A1. The invention is further directed to a method for the production of a hermetically gastight optoelectronic or electro-optical component.

In order to carry out measurements of the composition of gases or gas mixtures by means of sensors, particularly by means of infrared sensors (IR sensors), in a consistently reliable manner, the sensors must be encapsulated so as to be sealed in a gastight manner against the gases or gas mixtures to be investigated. Particularly when measurements are carried out at temperatures above room temperature, the materials of the sensors can change and drift can occur in the measured values taken by the sensors. This effect is exacerbated when the gases or gas mixtures have a corrosive effect on the materials of the sensors. In this regard, a particularly high content of water vapor and the presence of oxygen or radicals have a detrimental effect on the sensors. The same set of problems applies to IR emitters.

Therefore, it is known to hermetically encapsulate electronic components. A substrate (carrier) on which an electronic circuit is arranged is known from DE 33 35 530 A1. The circuit is completely covered by a cover cap (hereinafter "housing cap") made of a ceramic material, copper or steel. The housing cap has a circumferential edge with a solderable underside. The carrier can be a ceramic plate or a large-area enameled circuit board. A conductor track corresponding to a contour of the underside of the housing cap edge is printed on the carrier. The housing cap and the carrier are soldered together along this contour and are accordingly connected in a gastight manner. In a further arrangement from DE 33 35 530 A1, the housing cap is made entirely of steel and the carrier has an enamel-free metal zone which is welded to the housing cap edge along the metal zone. The required electric contacts to the encapsulated electronic circuit are guided through the carrier and fused in pressed glass in a gastight manner. The assembled housing cap can be filled with a gas in order to influence desired characteristics such as dew point or thermal conductivity.

An electronic component produced in this way is well shielded from environmental influences. However, the electronic component is not suitable for housing an optoelectronic or electro-optical converter element because no beam path exists between the converter element and a measuring environment.

The prior art (DE 20 2009 006 481 U1) discloses the possibility for a housing cap of an electronic component having an opening that is covered by a transparent window and accordingly allows a beam path between the converter element and a measuring environment. However, for the reasons mentioned above, the arrangement (means for protecting against spray water which are not formed in a gastight manner) disclosed in DE 20 2009 006 481 U1 cannot be used at temperatures substantially above room temperature or in environments with corrosive media. A combination of a transparent window according to DE 20 2009 006 481 U1 in a housing cap such as is described in DE 33 35 530 A1 would at least lack a hermetically gastight connection between the window and the housing cap.

SUMMARY OF THE INVENTION

It is the object of the invention to suggest a possibility by means of which consistently reliable measurements of the characteristics of the medium can be undertaken in measuring environments at temperatures above room temperature and with corrosive media. A further object of the invention is to make it possible to improve the protection of optoelectronic and electro-optical units against detrimental environmental influences even at high temperatures.

In a method for producing a hermetically gastight optoelectronic or electro-optical component with great robustness to heat and moisture, the above-stated object is met by the following important steps:

providing a carrier for at least one optoelectronic or electro-optical converter element which is used simultaneously as base plate of a housing, providing a housing cap having an opening at a bottom surface, producing at least one orifice in the housing cap such that after the housing cap is placed on the carrier an interior space for receiving the at least one converter element is accordingly formed by the housing cap above the carrier, radiation relevant for the at least one converter element can pass the housing cap in an unimpeded manner along a beam path oriented substantially orthogonal to the carrier between an orifice and the converter element, providing at least one window element which is transparent for the radiation relevant for the converter element and which has a shape and size adapted to the respective orifice of the housing cap and which has an edge metallization as contact surface for an edge area of the at least one orifice, assembling carrier, converter element, housing cap and the at least one window element, wherein a hermetically gastight connection is produced between the housing cap and the at least one window element by fusion of a metallic material between the edge metallization of the at least one window element and the housing cap, and a hermetically gastight connection is produced between the housing cap and the carrier in that a second seam of fused metallic material is formed in a hermetically gastight manner with the carrier, and the housing cap is positioned on the carrier before connecting to the carrier such that the at least one orifice is aligned opposite the respective required beam path of the at least one converter element.

Of course, steps a) to d) can be carried out in any sequence. It is important only that the elements, namely, carrier, housing cap, converter element and window element, have the above-described modifications at the start of assembly. It also does not matter whether the window element is connected to the housing cap first and the housing cap is then placed on the carrier or whether the latter step is carried out first and the window element is then connected to the housing cap. The step of connecting the housing cap to the carrier is likewise variable. It can be carried out before, after or at the same time that the window element is connected to the housing cap.

An optoelectronic converter element converts optical information, e.g., a detected electromagnetic radiation, into an electric signal (sensor). By electro-optical converter element is meant electronic circuits and devices which generate an optical signal from an electric signal (e.g., IR emitters, light emitting diodes). For the sake of simplicity, the term "converter element" will be used hereinafter.

The formation of a connecting seam by fusion of metallic material will be understood to mean collectively the joining techniques of soldering and welding. Soldering can be carried out either with the intermediary of a filler material (e.g., reflow soldering) or without filler material (e.g., diffusion brazing). In soldering, the melting temperatures of the materials of the respective elements to be joined is not reached. By contrast, in welding the melting temperatures of the materials of the respect elements to be joined are reached. Welding can be carried out with welding filler material (e.g., fusion welding) or without welding filler material (e.g., diffusion welding, resistance welding, pulse welding, friction welding).

A seam is formed along a joint line at which the elements to be joined (housing cap and carrier or window element) are to be connected to one another precisely when a continuous connection has been made between the joining elements after a temporary (transient) fusion of metallic material by the solidification of the same. Depending on the joining method selected, the fused metallic material can be a filler material, a welding filler material or the materials of the elements to be joined themselves.

Within the meaning of this description the technical term "hermetically gastight" is used for connections having a leak tightness (leak rate) of less than $10^{-8}$ mbar l/s, preferably even up to less than $10^{-10}$ mbar l/s. When referring to a hermetically gastight connection of housing cap and window element and carrier, respectively, it is self-evident that a seam of a fused metallic material is formed so as to be at least sufficiently long for the above-mentioned elements to be connected to one another in a hermetically gastight manner along the entire length of their contact with one another within the meaning of the definition given above.

In a preferred embodiment of the method according to the invention, the window element is produced as a plate of transparent material. The transparent material is preferably selected from the group of materials including sapphire ($Al_2O_3$), magnesium fluoride ($MgF_2$), magnesium oxide (MgO), lithium fluoride (LiF), calcium fluoride ($CaF_2$), barium fluoride ($BaF_2$), silicon (Si), silicon dioxide ($SiO_2$), germanium (Ge), zinc selenide (ZnSe), zinc sulfide (ZnS), cadmium telluride (CdTe), gallium arsenide (GaAs), titanium dioxide ($TiO_2$), partially stabilized zirconia ($ZrO_2$), a mixture of thallium bromide and thallium iodide (KRS 5; Tl(Br—I)), flint glass, or fused silica.

The edge metallization makes possible a selected method for producing the seam by fusion of metallic material. The edge metallization facilitates a bonding between the materials of the elements to be joined. If the material of an element to be joined, e.g., the material of the window element, is not itself solderable or weldable, for example, the edge metallization makes it possible in the first place to connect by means of a seam using fused metallic materials.

The edge metallization can be an individual layer of a metallic material. In further embodiments of the invention, it can be a layer sequence of at least two layers. A layer sequence of this type contains at least one layer of one of the metals chromium, nickel, iron, titanium, platinum, palladium and gold. By combining at least two metals as layers of the layer sequence, it is possible to advantageously promote adhesion between the elements to be joined. The materials, thicknesses, sequence and quantity of layers of the layer sequence can be selected corresponding to the materials of the elements to be joined and of the joining method employed. Advantageous layer sequences are, for example, combinations of chromium and nickel, of iron-nickel and gold, or of titanium and platinum or palladium and gold.

In preferred embodiment forms of the method according to the invention, titanium or chromium are used as adhesion promoters for the substrate. Platinum, palladium or iron-nickel can be used as metallic materials for producing a solder connection. Further, gold or nickel can be used to generate a protective layer and/or a wetting layer.

The edge metallization is preferably produced by means of a vapor deposition process such as CVD (chemical vapor deposition) or PVD (physical vapor deposition) or by means of an electrochemical process, e.g., a galvanic process.

If a material which is not solderable or not weldable is selected for the carrier and/or the housing cap, suitable edge metallizations can also be arranged on the carrier, on the housing cap or on both carrier and housing cap.

In order to minimize the presence of reactive chemical elements or compounds and/or radicals in the interior of the electronic component, the interior space can be filled with a gas or with a gas mixture before producing the hermetically gastight connection between the housing cap and the carrier. The interior space can also be evacuated instead. Further, it is possible to first fill the interior space with a scavenging gas and then evacuate it. Any remainder of reactive elements or compounds and radicals can be further reduced by the latter procedure.

Ceramics, metals such as steel or nickel, metal alloys and composite materials, for example, are selected as material for the housing cap. The material must allow a leak rate of less than $10^{-8}$ mbar l/s to be maintained. Kovar can also be selected as material. By Kovar is meant alloys which have low expansion coefficients and which can be easily adapted to expansion coefficients. This is favorable, for example, for reducing tension at the connection between the housing cap and window element.

The carrier can be made of ceramic, metals such as steel or nickel, metal alloys and composite materials or Kovar, for example.

The electronic component produced by the method according to the invention proves to be very robust with respect to environmental conditions such as heat and moisture. Accordingly, permissible measurement tolerances are also still maintained after at least 10,000 hours at a temperature of 250° C. by electronic components according to the invention. Further tests demonstrated the robustness of the electronic components even after 18,000 hours at 185° C. The electronic components likewise show permissible measurement tolerances under continuous load of at least 3,000 hours at −55° C. Further, the electronic components are robust to thermal cycling from +20° C. to +200° C. and from −40° C. to +85° C. Rapid changes in temperature with transition times of less than 10 seconds and gradual temperature changes with rates of change of 5 K/min over a cycle number of at least 1000 are also withstood. Further, the electronic components are robust to a pressure of 400 kPa. Further, the electronic components are robust to temperature/air humidity loads of 85° C./85% RH (=491 hPa) for 8,500 hours and at 95° C./95% RH (=803 hPa) for 5200 hours.

The above-stated object is further met by an electronic component which has a housing having a housing cap, a carrier as base plate of the housing and an interior space which is enclosed by the housing cap and the carrier, and at least one optoelectronic or electro-optical converter element which is arranged in the interior space and which has electric contacts which are guided through the carrier and arranged in the carrier in a hermetically gastight manner. The housing cap is closed in a hermetically gastight manner by the carrier through a bonding connection of fused metal. An electronic component according to the invention is characterized in that at least one orifice is provided in the housing cap such that radiation relevant for the at least one converter element can pass the housing cap between the orifice and the converter element along a beam path oriented substantially perpendicular to the carrier. The at least one orifice is closed in a hermetically gastight manner by means of at least one window element, wherein the window element is connected to the housing cap in a hermetically gastight manner along an edge metallization of the window element by a circumferential first seam of a fused metallic material around the at least one orifice. The window element is transparent at least for the radiation relevant for the at least one converter element.

In a first embodiment of the electronic component according to the invention, the at least one converter element is an optoelectronic receiver so that the electronic component is a robust sensor.

At least one optical filter is associated with at least one of the orifices in the respective beam path. This optical filter (hereinafter also abbreviated as "filter") differs from the window element which, although it is transparent for the radiation that is relevant for the converter element, inevitably has an unavoidable optical effect (refraction, absorption, transmissivity). The filter can be dimensioned in such a way that it is optically active in a plurality of beam paths. A plurality of filters can be arranged in a beam path. The filters can be individually tilted relative to the beam path or tiltable relative to the beam path in a selectable and controlled manner. Corrections of the wavelengths of the detected and emitted radiation are possible by means of a controlled tilting of one or more optical filters. Since an optical filter usually comprises more than one optical layer, the path length of the respective beam path within the optical filter and the angle of incidence of rays of the radiation on the optical filter can be adjusted by tilting. Characteristics of the radiation (e.g., wavelength) can be selectively influenced through the effect of path lengths and interface effects such as interferences.

In addition to, or instead of, one or more optical filters, optically active elements such as diaphragms, for example, can also be arranged in the beam path. Unwanted stray radiation can be extensively blocked by means of diaphragms which are provided, for example, in addition to at least one filter in the beam path.

A beam path is perpendicular when it extends along an optical axis between converter element and orifice and the optical axis is orthogonal to a surface of the converter element receiving or emitting radiation. A beam path is also considered "substantially perpendicular" when the optical axis is inclined by up to 15° relative to the surface normal of the receiving or emitting surface of the converter element.

Radiation is relevant for the converter element when this radiation can be detected by, or is emitted by, the converter element.

A plurality of beam paths are present when at least two orifices are provided. In an electronic component according to the invention, the at least two orifices are closed in a hermetically gastight manner by at least one window element. The beam paths can be separate beam paths to an optoelectronic receiver in each instance. Either one orifice or at least two orifices can be closed in a hermetically gastight manner by a window element respectively.

In a further embodiment of the electronic component according to the invention, the separate beam paths to a respective receiver are formed as at least one measurement beam path and at least one reference beam path. In this case, it is advantageous when the measurement beam path and the reference beam path are as close as possible to one another to ensure good comparability of the measurement beams and reference beams.

It is possible to provide an intermediate space between the optical filter and the window element. This prevents a direct contact of optical filter and window element on the one hand and, on the other hand, the optical filter is exposed to fewer thermal stresses when connecting window element and housing cap if the optical filter has been arranged in the beam path within the interior space of the housing beforehand.

Further, an intermediate space advantageously prevents unwanted gas from collecting directly between the optical filter and the window element and leading to compressive strains on the optical filter. These unwanted gases can occur as the result of trapped air and/or material inclusions during assembly, for example. If these air pockets and/or material inclusions are heated during operation of the electronic component, outgassing or expansion of the unwanted gases can result.

For this reason, it is further very advantageous when the interior space of the housing and the intermediate space between the optical filter and the window element are connected by at least one channel for gas exchange and pressure equalization.

In a further embodiment of the electronic component according to the invention, the converter element is an electro-optical radiation source. The reflector is arranged, preferably in a rotationally symmetrical manner, along an initial portion of the beam path so that the electronic component is formed as an emitter unit for emitting a directed beam bundle. The reflector can be formed as a part of the housing wall. For example, an inner side of the housing can be formed correspondingly as a reflector and can be coated if required. A surface treatment such as polishing or texturing is equivalent to coating.

Another possibility for providing an emitter unit consists in that the converter element is an electro-optical radiation source and a reflector is provided on the housing cap over the orifice so that the electronic component is formed with the reflector as an emitter unit for emitting a directed beam bundle. In a construction of this kind, the reflector is arranged outside of the housing. In a simple instance, the reflector is attached to the housing. The reflector is preferably additionally secured in position, for example, by bonding engagement (gluing, soldering, welding) or by frictional engagement. A construction of this kind allows an electronic component to be fabricated with a reflector which is selected depending on the situation.

The electronic component according to the invention can be used in its various embodiments and production variants in a measuring cell. The electronic component can be employed particularly for use in IR measuring cells for measuring and analyzing gases and gas mixtures.

A measuring cell of the type mentioned above has at least one electronic component constructed as a sensor and at least one electronic component constructed as an emitter unit. The two electronic components are positioned opposite to one another along a common axis. They are held at a defined distance by means of a measuring cell housing. The defined distance forms a measuring path along which measurements of characteristics of a gas or gas mixture located in the measuring cell or conducted through the measuring cell take place.

In a further embodiment of a measuring cell according to the invention, there is likewise at least one electronic component which is formed as a sensor and at least one electronic component which is formed as an emitter unit. The two electronic components are arranged next to one another and positioned along a common optical axis which is deflected at least once. At least one mirror unit which is held opposite the two electronic components by means of a measuring cell housing is provided for deflecting the optical axis. The at least one mirror unit is considered to be arranged and held opposite the electronic components when the optical axis is formed as a common optical axis of the electronic components and is deflected by action of the mirror unit. Further mirror units which are also held opposite the electronic components can be provided.

In addition, it is possible that at least one mirror unit is arranged between or adjacent to the electronic components. By virtue of an arrangement of this kind, the optical axis can be folded multiple times and a correspondingly long measuring path can accordingly be realized between the emitter and the sensor in the measuring cell without the measuring cell housing having a length of several decimeters. All of the mirror units or individual mirror units can be controllable and displaceable. Mirror units can contain, for example, one or more simple metallic mirrors, dichroic mirrors, interference mirrors, (micro-)mirror arrays and/or imaging mirrors, e.g., elliptical (concave) mirrors, and, in case of the latter arrangement, the emitter unit and sensor are arranged in the two foci of the ellipse.

The measuring cell housing is preferably formed as a tubular formation with openings for the passage of gas. A tubular formation can have a round, oval, irregular or angled cross section. The cross section can change in shape and dimensions over a length of the measuring cell housing. A metal such as steel or aluminum can be used as the material of the measuring cell housing. Aluminum is an advantageous material because it is readily anodizable.

The inventive solution to the problem stated above is premised on a housing cap of a housing of an electronic component, which housing cap has an opening at the bottom surface of the housing cap and which is characterized in that at least one orifice is further provided in the housing cap which is closed in a hermetically gastight manner by a window element of predetermined transparency, wherein the window element is connected to the housing cap in a hermetically gastight manner along an edge metallization of the window element around the at least one orifice by a circumferential seam of temporarily (transiently) fused metal.

BRIEF DESCRIPTION OF THE DRAWINGS

The invention will be described in more detail in the following with reference to drawings and embodiment examples. In the drawings.

DETAILED DESCRIPTION OF THE PREFERRED EMBODIMENTS

Figure 1:
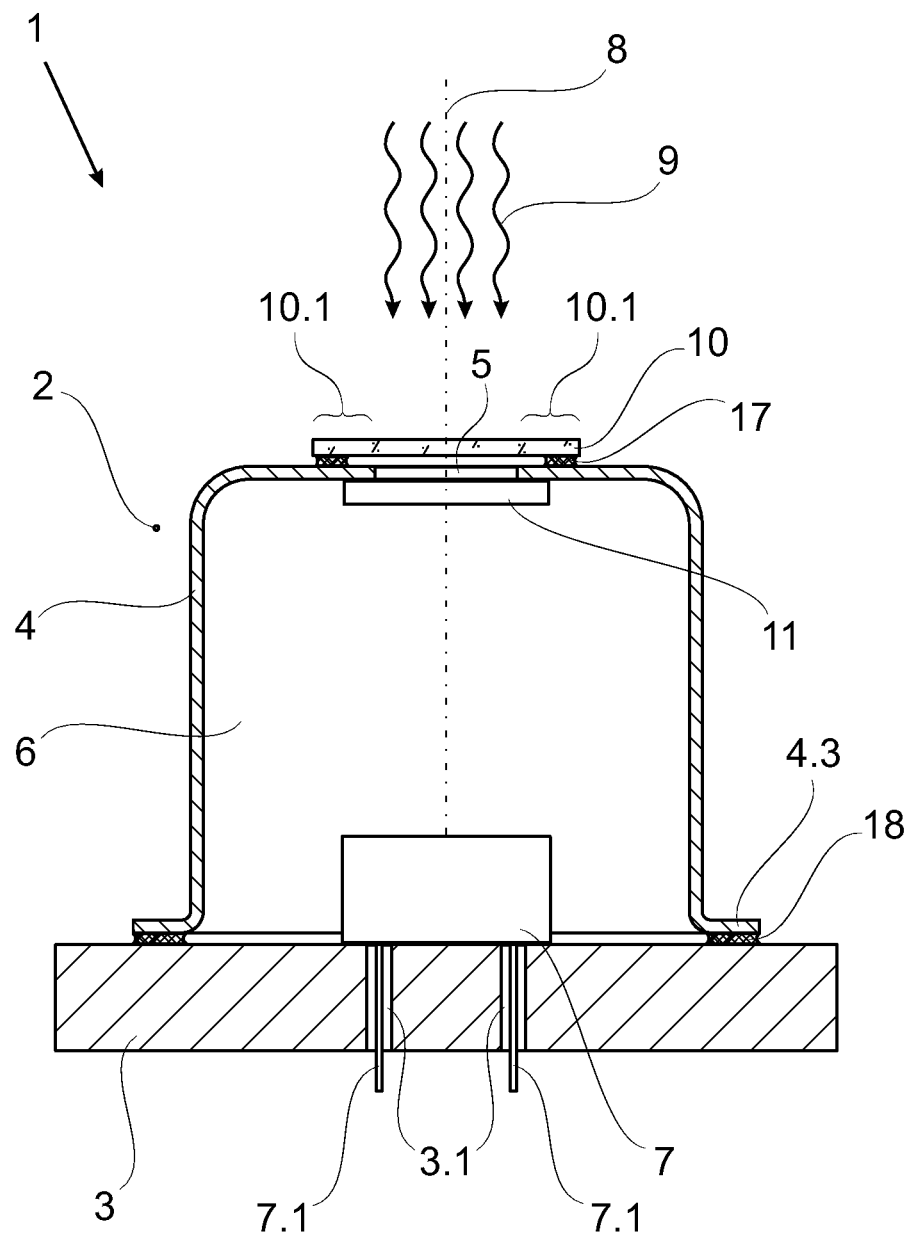
FIG. 1 is a schematic illustration of a first embodiment of an electronic component according to the invention with a converter element in longitudinal section.

An electronic component 1 according to the invention has as essential elements a housing 2 which is formed by a housing cap 4 with an orifice 5 and a carrier 3 above which there is placed the housing cap 4, and a window element 10 and an optoelectronic or electro-optical converter element 7 (FIG. 1).

The carrier 3 is formed as a plate of Kovar and serves as a base plate for the housing 2. The housing cap 4 is placed in a hood-like manner on a surface of one of the lateral surfaces of the carrier 3. An interior space 6 in which the converter element 7 is arranged is surrounded by the inner sides of housing cap 4 and areas of the lateral surface of carrier 3. Converter element 7 has contact elements 7.1 for electrically contacting the converter element 7 which are guided through contact holes 3.1 of carrier 3 and fused with glass in the contact holes 3.1 so as to be hermetically gastight.

The housing cap 4 is made of nickel and has an opening 4.2 (see also FIG. 2) in its bottom surface 4.1. The wall of the housing cap 4 is bent outward around the opening 4.2 and accordingly forms a circumferential edge 4.3 bounding the opening 4.2. In a region of the housing cap 4 facing upward, an orifice 5 is provided opposite carrier 3 in the housing cap 4. The window element 10 is arranged outside interior space 6 over orifice 5 and completely covers orifice 5. An optical filter 11 is held in interior space 6 directly below orifice 5. A beam path 8 for radiation 9 which is relevant for converter element 7 is realized from orifice 5 to converter element 7. Optical filter 11 is arranged in this beam path 8. For the sake of simplicity, no holders for the above-described elements, e.g., optical filter 11, are shown in FIGS. 1 to 11.

Figure 2:
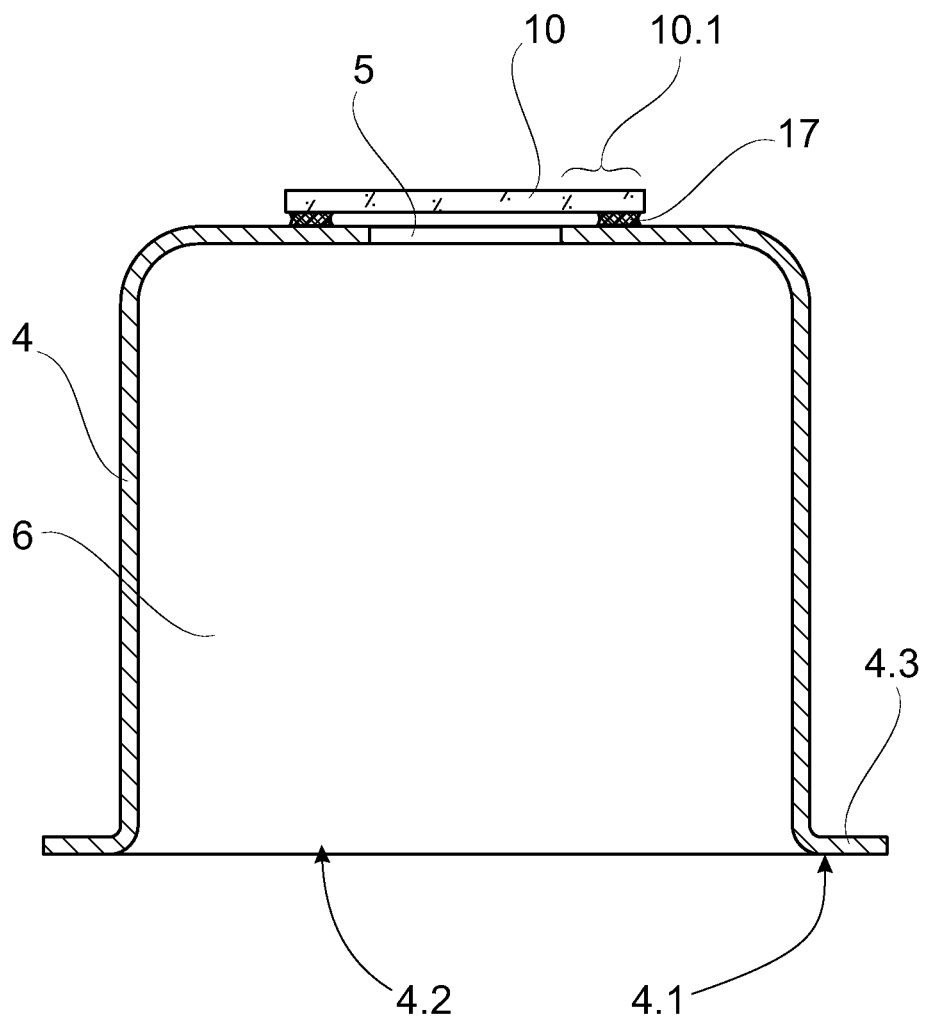
FIG. 2 is a schematic diagram of a housing cap according to the invention.

Window element 10 has greater dimensions than orifice 5 and has an edge area 10.1 which protrudes over orifice 5 on all sides (see also FIG. 2). An edge metallization 10.2 is provided on the edge area 10.1 on the lateral surface of the window element 10 facing the housing cap 4 (bottom lateral surface). A first seam 17 which is formed by fused filler material is provided between edge metallization 10.2 and the region of housing cap 4 around orifice 5. Window element 10 and housing cap 4 are connected with one another by first seam 17 so as to be hermetically gastight.

Housing cap 4 is welded to carrier 3 in a hermetically gastight manner along circumferential edge 4.3 by a second seam 18.

A housing cap 4 according to the invention is shown in FIG. 2. As was described with reference to FIG. 1, the housing cap 4 surrounds the interior space 6 on five sides. The bottom surface 4.1 has opening 4.2 which is bounded by circumferential edge 4.3. The window element 10 is arranged above orifice 5 by means of first seam 17 and is connected to housing cap 4 in a hermetically gastight manner.

Figure 3:
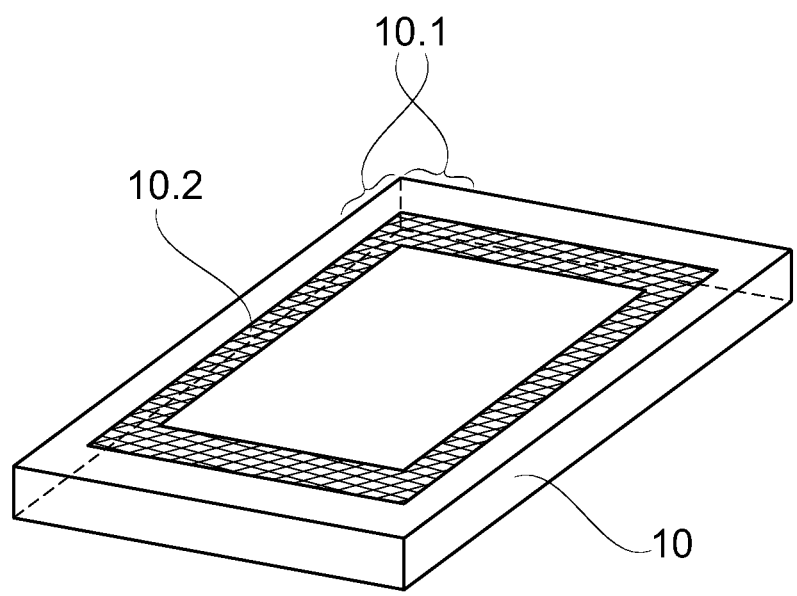
FIG. 3 is a schematic diagram of a window element according to the invention.

A perspective view of the bottom lateral surface of a window element 10 according to the invention in FIG. 3 shows edge area 10.1 and the edge metallization 10.2 which is formed circumferentially on the lateral surface. Edge metallization 10.2 comprises at least two metallic layers which are vapor deposited one above the other on a circumferential portion of the edge area.

In further embodiments of the invention, edge metallization 10.2 can also be sputtered on by PVD.

Figure 4:
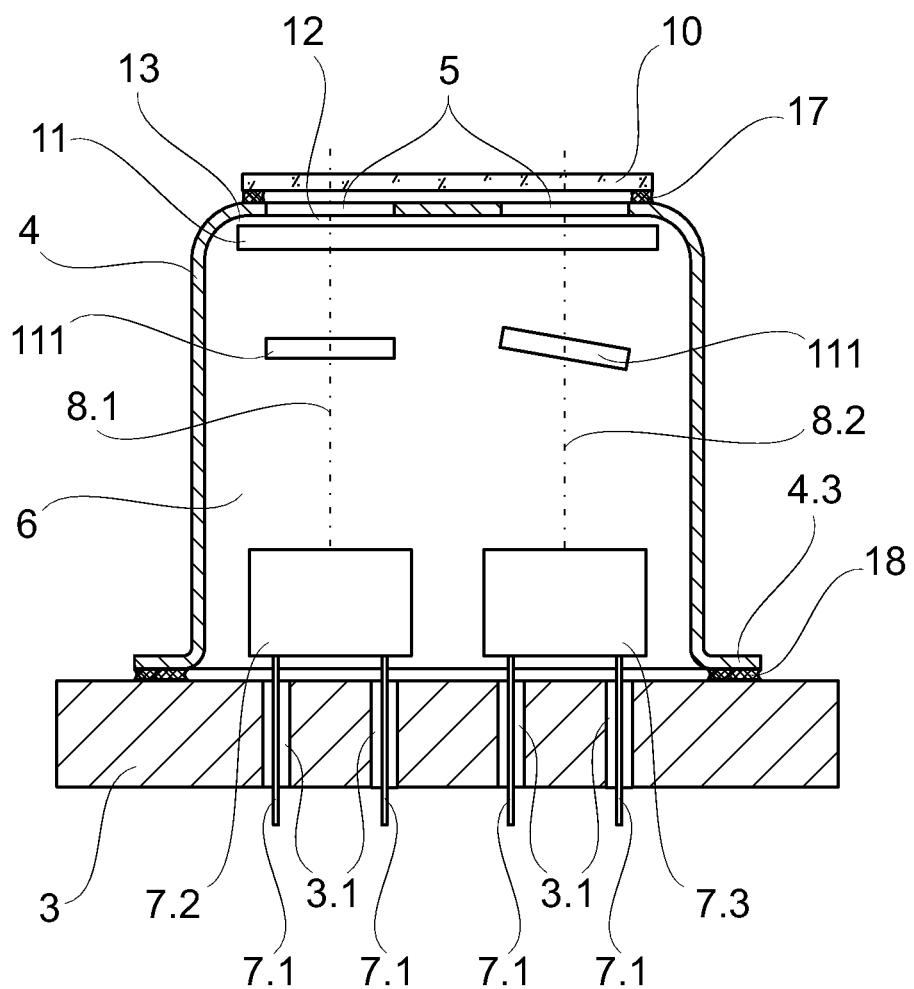
FIG. 4 is a schematic illustration of a second embodiment of an electronic component according to the invention with two converter elements in longitudinal section.

A second embodiment of the electronic component according to the invention shown in FIG. 4 is outfitted with a first converter element 7.2 and a second converter element 7.3. An orifice 5 is provided in housing cap 4 above first converter element 7.2 and second converter element 7.3. The two orifices 5 are covered and closed in a hermetically gastight manner by a common window element 10. There is a first beam path 8.1 between the first converter element 7.2 and the orifice 5 provided above the latter and there is a second beam path 8.2 between the second converter element 7.3 and the orifice 5 provided above the latter. An optical filter 11 is arranged in the two beam paths 8.1, 8.2 at a distance from orifices 5 such that an intermediate space 12 is formed between optical filter 11, orifices 5 and the window element. The intermediate space 12 communicates with the interior space 6 through a channel 13. Farther downstream along the two beam paths 8.1, 8.2, there is arranged in each instance a further optical filter 11 which is associated exclusively with the first beam path 8.1 and exclusively with the second beam path 8.2, respectively. While the further optical filter 111 in the first beam path 8.1 is oriented orthogonal to the first beam path 8.1, the further optical filter 111 in the second beam path 8.2 is tilted with respect to the second beam path 8.2. The first beam path 8.1 is a measurement beam path and the second beam path 8.2 is a reference beam path.

In further embodiments of the electronic component according to the invention, the further filters 111 can also both be tilted relative to the first beam path 8.1 and relative to the second beam path 8.2, respectively, in order to adjust optical parameters of the two beam paths 8.1, 82, for example. To this end, the further filters 111 are designed to be adjustable, i.e., their tilt angles can be selectively varied and adjusted.

Each converter element 7.2 and 7.3 has contact elements 7.1 which are guided through contact holes 3.1 of the carrier 3 and cast integral therein with glass so as to be hermetically gastight. Housing cap 4 is connected to carrier 3 by second seam 18. In this example, second seam 18 is produced by means of a pulse welding method. In this case, no weld filler material is used; rather, the material of housing cap 4 and of carrier 3 is partially fused in the region of circumferential edge 4.3 and of carrier 3 below circumferential edge 4.3.

Figure 5:
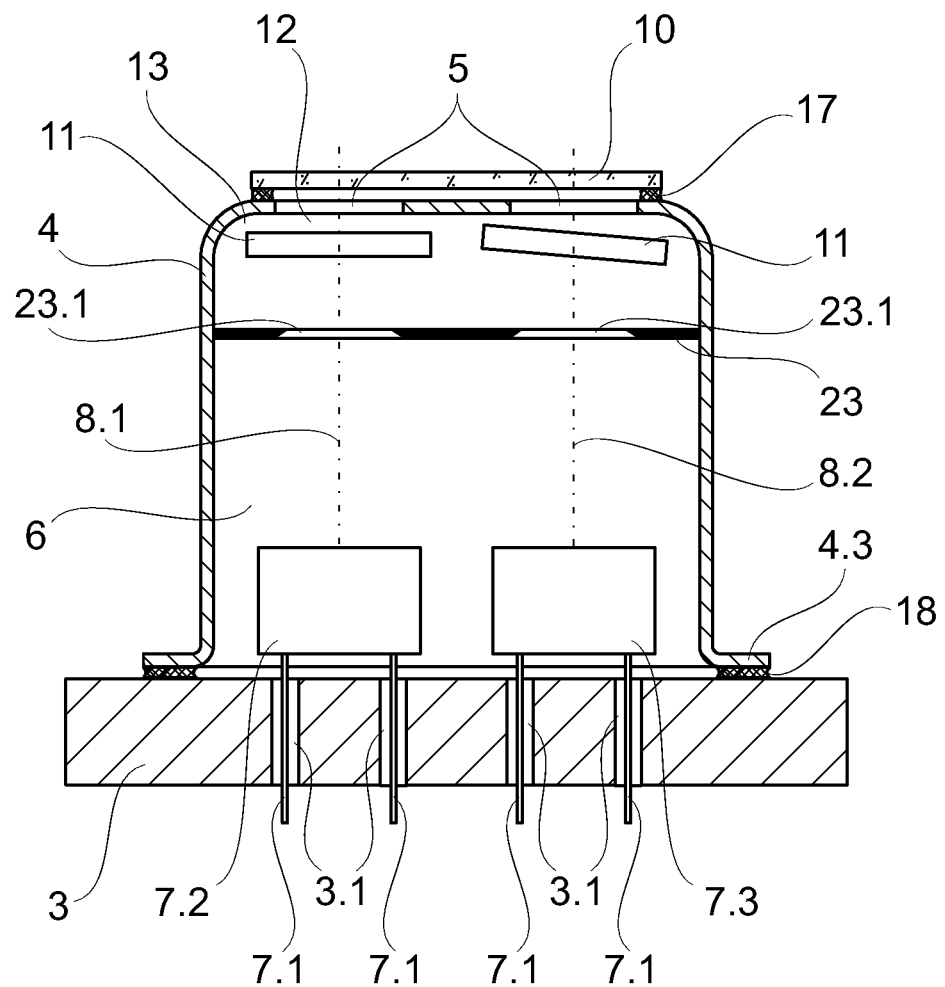
FIG. 5 is a schematic illustration of a third embodiment of an electronic component according to the invention with two converter elements in longitudinal section.

In a third embodiment example of the electronic component 1 according to the invention which is shown in FIG. 5, the construction basically corresponds to that shown in FIG. 4, but an optical filter 11 is associated with the first beam path 8.1 and the second beam path 8.2 in each instance. Further, a diaphragm 23 with a diaphragm aperture 23.1 is provided in beam paths 8.1 and 8.2. The diaphragms 23 have edges which extend up to the inner side of housing cap 4 and accordingly divide the interior space 6 horizontally. The radiation 9 can only pass through the respective diaphragm aperture 23.1. This prevents unwanted stray radiation from propagating along the first beam path 8.1 and second beam path 8.2. Stray radiation may be caused, for example, by radiation components exiting from the front sides of the optical filter 11 and/or further optical filter 111.

Figure 6:
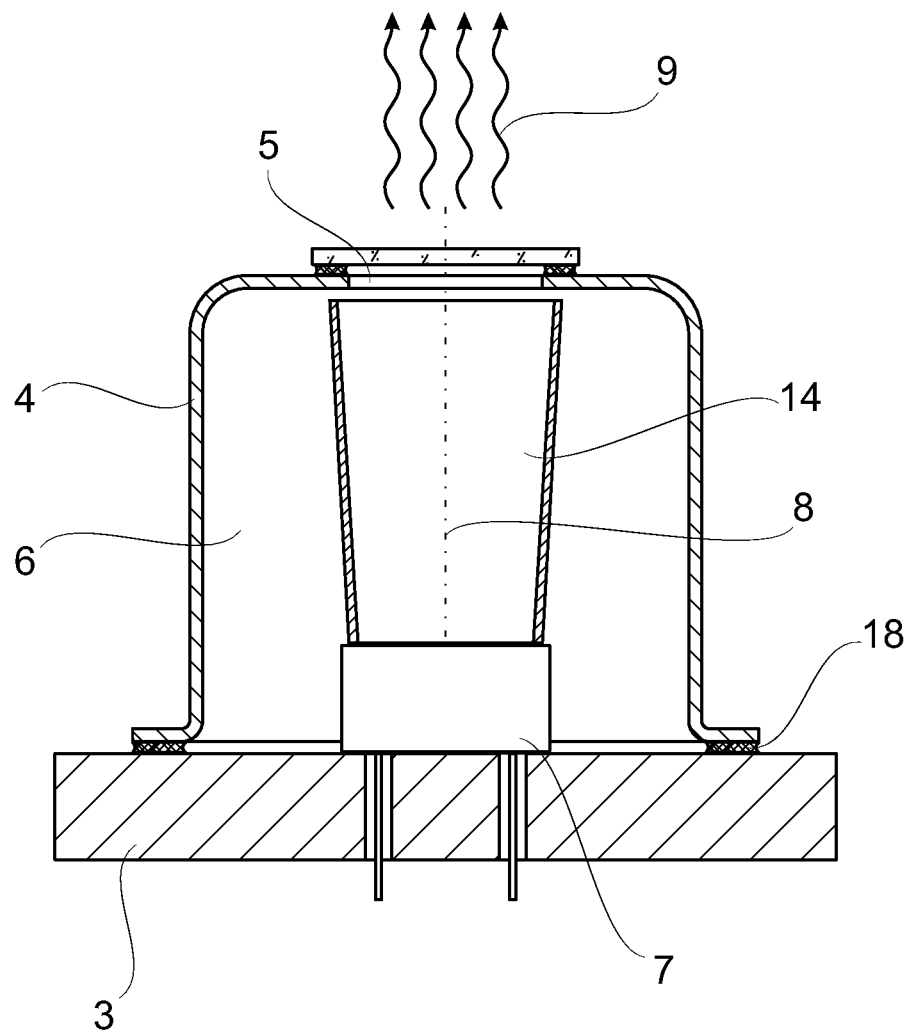
FIG. 6 is a schematic illustration of a fourth embodiment of an electronic component according to the invention with a first embodiment of an inner reflector in longitudinal section.

In a fourth embodiment example of the electronic component 1 according to the invention, a converter element 7 is arranged in the interior space 6 (FIG. 6). Housing cap 4 has an orifice 5. The converter element 7 is an electro-optical converter element and is designed to emit radiation 9 in a wavelength range of infrared radiation between 0.8 and 25 µm. An inner reflector 14 is arranged above converter element 7 in interior space 6 such that a first portion of the beam path 8 is surrounded in a rotationally symmetrical manner by the inner reflector 14. The inner reflector 14 has a conical shape and is provided on its inner side with a coating (not shown) which reflects IR radiation. Converter element 7, inner reflector 14 and orifice 5 are aligned with respect to one another such that radiation 9 emitted by converter element 7 is collected through the inner reflector 14 and emitted through orifice 5 as directed beam bundle. Inner reflector 14 is soldered to converter element 7. In further arrangements, inner reflector 14 is held by a holding device (not shown). The second seam 18 is formed by soldering.

In further arrangements, inner reflector 14 can also have elliptical or parabolic shapes. Moreover, it can also be shaped in a freeform manner, for example, by a combination of elliptical and parabolic segments.

Figure 7:
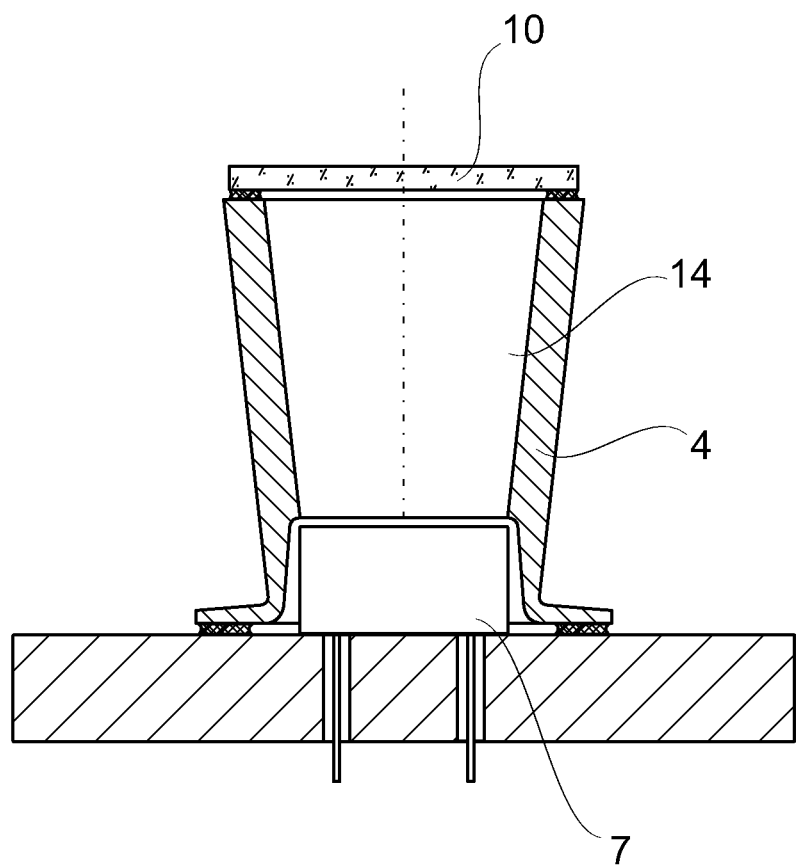
FIG. 7 is a schematic illustration of a fifth embodiment of an electronic component according to the invention with a second embodiment of an inner reflector in longitudinal section.

In an alternative construction of the inner reflector 14, an inner side of housing cap 4 is shaped as an inner reflector 14 and is coated, as is shown schematically in FIG. 7.

Figure 8:
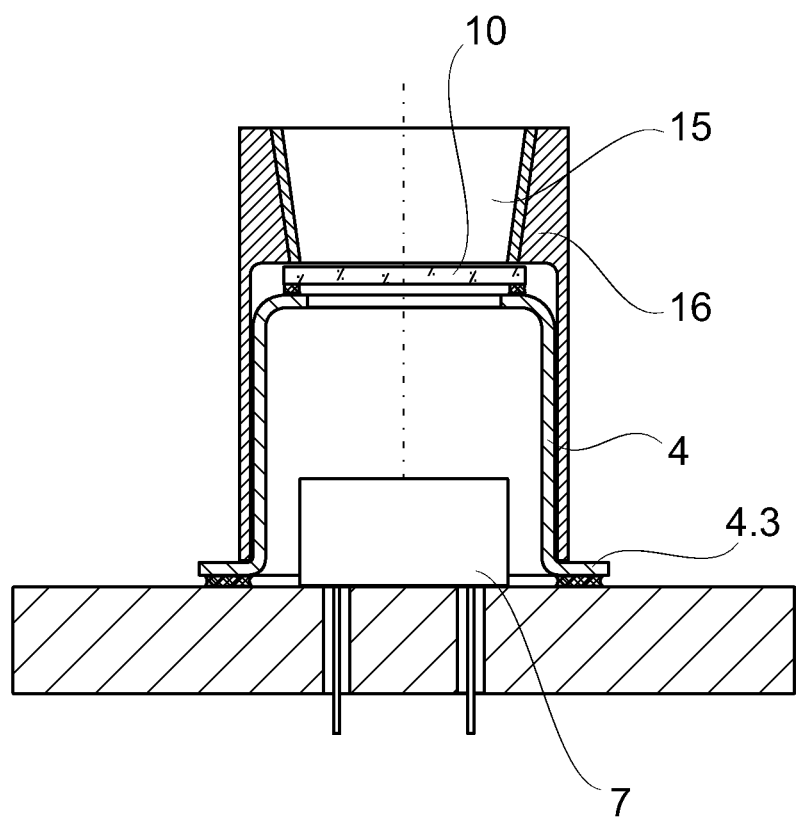
FIG. 8 is a schematic illustration of a sixth embodiment of an electronic component according to the invention with an outer reflector in longitudinal section.

In a sixth embodiment of an electronic component 1 according to the invention, an outer reflector 15 is placed on housing cap 4 above window element 10 (FIG. 8). The outer reflector 15 has a reflector holder 16 on the side thereof. Housing cap 4 is laterally surrounded by the reflector holder 16. In order to achieve a highly accurate positioning of outer reflector 15, reflector holder 16 is on the upper side of the bent circumferential edge 4.3. In further embodiments, outer reflector 15 can be bondingly connected, particularly glued, soldered or welded, to housing cap 4 over the surface, over some areas or by spots.

Figure 9:
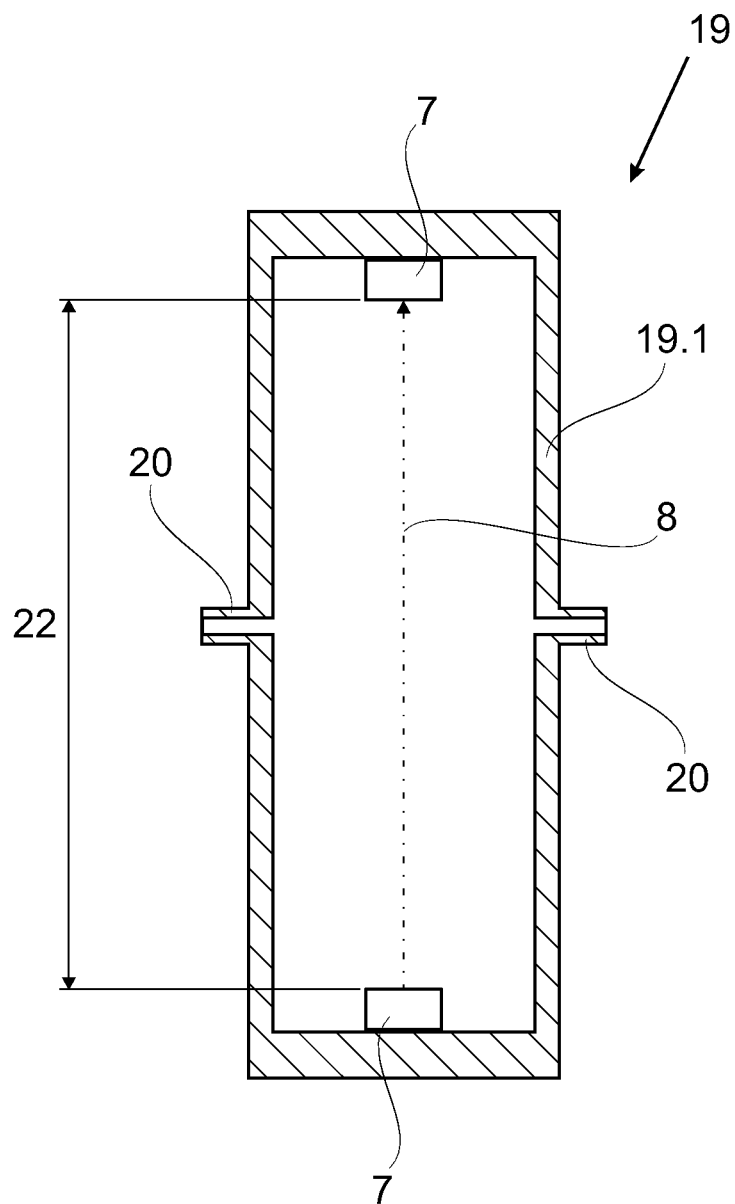
FIG. 9 is a schematic illustration of a first embodiment of a measuring cell according to the invention.

A first embodiment example of a measuring cell 19 using the optoelectronic and electro-optical converter element 7 according to the invention is shown schematically in FIG. 9. The measuring cell 19 has a tubular measuring cell housing 19.1 of aluminum, two through-holes 20 being provided in the side walls thereof for guiding in and guiding out a medium to be measured. The measuring cell housing 19.1 can be cylindrically tubular or can also have a tubular shape in the form of an n-sided prism (shown only in FIG. 11). An electro-optical converter element 7 functioning as emitter unit is arranged at a front end of the measuring cell housing 19.1. Another optoelectronic converter element 7 functioning as sensor is arranged at the other front end of the measuring cell housing 19.1. The two converter elements 7 face one another and are located opposite one another. The extensions of the beam paths 8 of the two converter elements 7 form a common optical axis and are indicated by a dashed line. A measuring path 22 is defined by the spacing between the converter elements 7.

Figure 10:
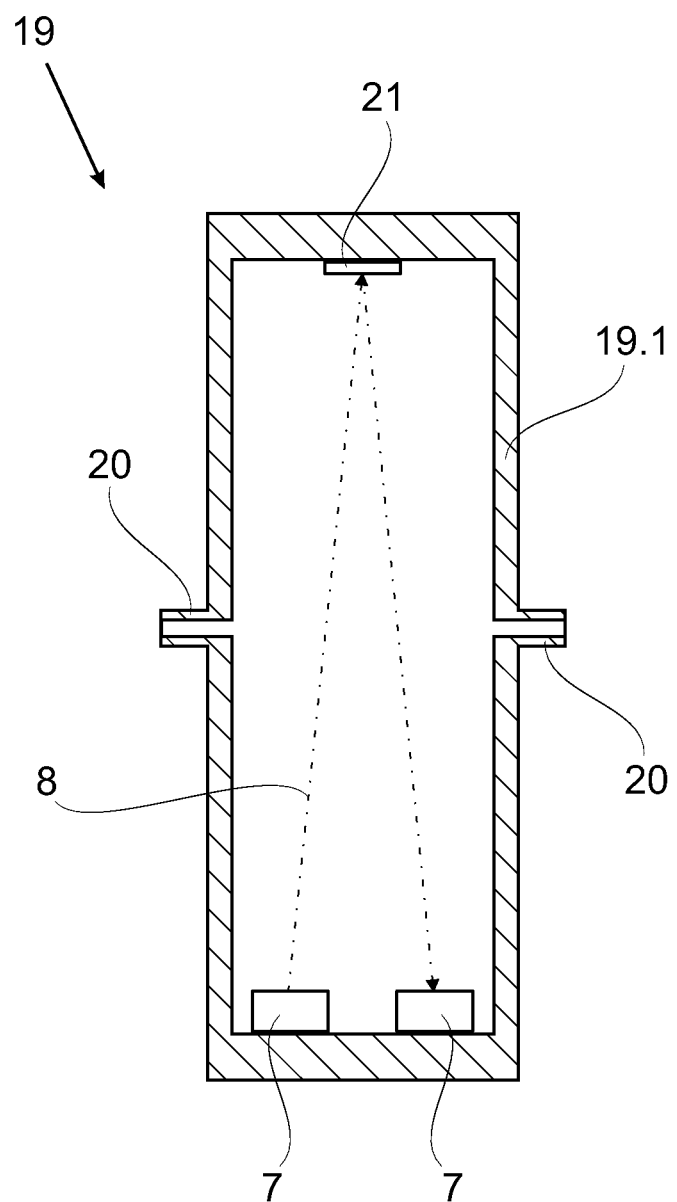
FIG. 10 is a schematic illustration of a second embodiment of a measuring cell according to the invention with a mirror unit.

A second embodiment of a measuring cell 19 according to the invention is shown in FIG. 10. Two converter elements 7, one of which is formed as sensor and one as emitter unit, are arranged side by side at the front end of the measuring cell housing 19.1. The two converter elements 7 face in direction of the opposite end of the measuring cell housing 19.1. A mirror unit 21 is arranged at the opposite end of the measuring cell housing 19.1 such that a common optical axis which is folded once is defined between the two converter elements 7. By means of this step, the measuring path 22 (represented by a dashed line) is more than doubled with the length of the measuring cell housing 19.1 remaining the same.

Figure 11:
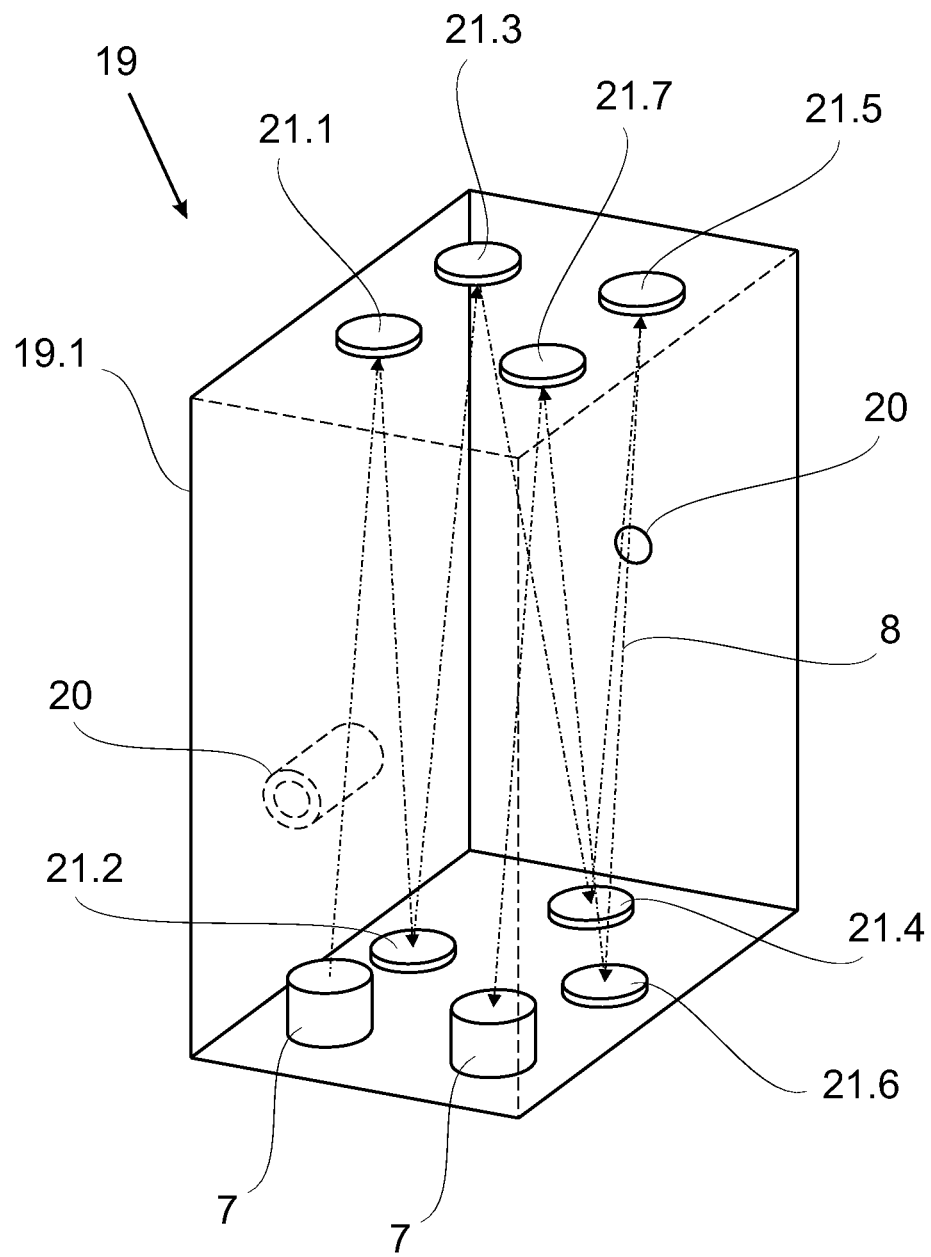
FIG. 11 is a schematic illustration of a third embodiment of a measuring cell according to the invention with a plurality of mirror units.

In order to lengthen the measuring path 22 even further with the length of the measuring cell housing 19.1 remaining the same, further mirror units 21 can be arranged as is shown in FIG. 11. In this third embodiment example of the measuring cell 19, two converter elements 7 are again arranged side by side, one converter element 7 being formed as sensor and the other converter element 7 being formed as emitter unit. At the opposite end of the measuring cell housing 19.1, four mirror units 21, i.e., a first mirror unit 21.1, a third mirror unit 21.3, a fifth mirror unit 21.5 and a seventh mirror unit 21.7 are arranged side by side. A second mirror unit 21.2, a fourth mirror unit 21.4 and a sixth mirror unit 21.6 are provided adjacent to the two converter elements 7. A common optical axis of the two converter elements 7 is folded seven times and extends from the one converter element 7 to the first mirror unit 21.1, then to the second mirror unit 21.2 and further successively until the seventh mirror unit 21.7 and then to the other converter element 7. As a result of this arrangement, the measuring path 22 (dashed line) is more than eight times as long as the measuring path 22 in the first embodiment example according to FIG. 9.

REFERENCE NUMERALS 1 electronic component
2 housing
3 carrier
3.1 contact hole
4 housing cap
4.1 bottom surface
4.2 opening
4.3 circumferential edge
5 orifice
6 interior space
7 converter element
7.1 contact elements
7.2 first converter element
7.3 second converter element
8 beam path
8.1 first beam path
8.2 second beam path
9 radiation
10 window element
10.1 edge area
10.2 edge metallization
11 optical filter
111 further optical filter
12 intermediate space
13 channel
14 inner reflector
15 outer reflector
16 reflector holder
17 first seam
18 second seam
19 measuring cell
19.1 measuring cell housing
20 through-hole
21 mirror unit
21.1 first mirror unit
21.2 second mirror unit
21.3 third mirror unit
21.4 fourth mirror unit
21.5 fifth mirror unit
21.6 sixth mirror unit
21.7 seventh mirror unit
22 measuring path
23 diaphragm
23.1 diaphragm aperture

What is claimed is:

1. A method for producing a hermetically gastight optoelectronic or electro-optical component, the method comprising:
   a) providing a carrier for at least one optoelectronic or electro-optical converter element, the carrier also serving as a base plate of a housing;
   b) providing a housing cap having an opening at a bottom surface such that, after the housing cap is placed on the carrier, an interior space for receiving the at least one converter element is formed by the housing cap above the carrier;
   c) producing at least one orifice in the housing cap for passing through desired radiation through the at least one orifice in the housing cap along a desired beam path oriented substantially orthogonally to the carrier and having an axis that substantially centrally penetrates the at least one orifice and the at least one converter element;
   d) providing at least one window element transparent to the radiation, the at least one window element having a shape and a size adapted to the orifice of the housing cap and having an edge area with an edge metallization as a contact surface, the edge metallization of the edge area of the window element being made as a layer sequence of at least two layers, wherein the edge area of the window element is coated with a first layer of chromium or titanium and a second layer comprising one of iron-nickel, platinum or palladium, said second layer being deposited on top of the first layer and said edge metallization including a circumferential seam of fused metallic material;
   e) assembling the carrier, the converter element, the housing cap and the at least one window element to form a hermetically sealed gastight connection between the housing cap and the edge area of the at least one window element by fusing a metallic material between the edge metallization of the at least one window element and the housing cap, and to form a hermetically sealed gastight connection between the housing cap and the carrier by fusing a metallic material between the housing cap and the carrier, wherein positioning the housing cap on the carrier comprises aligning the at least one orifice along the beam path opposite the at least one converter element.

2. The method according to claim 1, further comprising producing the window element as a plate of transparent material selected from the group consisting of sapphire ($Al_2O_3$), magnesium fluoride ($MgF_2$), magnesium oxide (MgO), lithium fluoride (LiF), calcium fluoride ($CaF_2$), barium fluoride ($BaF_2$), silicon (Si), silicon dioxide ($SiO_2$), germanium (Ge), zinc selenide (ZnSe), zinc sulfide (ZnS), cadmium telluride (CdTe), gallium arsenide (GaAs), titanium dioxide ($TiO_2$), Y-partially stabilized zirconia ($ZrO_2$), a mixture of thallium bromide and thallium iodide (KRS 5; Tl(Br—I)), flint glass, fused silica, and combinations thereof.

3. The method according to claim 1, wherein the edge metallization further comprises a third layer of gold or nickel as a protective or wetting layer.

4. The method according to claim 1, wherein the edge metallization is produced by a vapor deposition process or by an electrochemical process.

5. The method according to claim 1, wherein the interior space is either filled with a gas or a gas mixture or is evacuated before producing the hermetically gastight connection between the housing cap and the carrier.

* * * * *